United States Patent [19]

Roy et al.

[11] Patent Number: 5,502,730
[45] Date of Patent: Mar. 26, 1996

[54] PARTIAL SCAN TESTABILITY UTILIZING RECONVERGENCE THROUGH SEQUENTIAL ELEMENTS

[75] Inventors: Rabindra K. Roy, Plainsboro, N.J.; Toshinobu Ono, Yokohama, Japan

[73] Assignees: NEC USA, Inc., Princeton, N.J.; NEC Corporation, Tokyo, Japan

[21] Appl. No.: 258,585

[22] Filed: Jun. 10, 1994

[51] Int. Cl.$^6$ .................................................. H04B 17/00
[52] U.S. Cl. .................. 371/22.3; 371/22.1; 395/183.06; 364/488; 364/489
[58] Field of Search .............................. 371/22.3, 23, 27, 371/22.1, 22.5, 22.4, 22.2, 25.1; 364/484, 491, 570, 490, 488; 324/158.1, 73.1; 395/183.06

[56] References Cited

U.S. PATENT DOCUMENTS

| | | | |
|---|---|---|---|
| 5,043,986 | 8/1991 | Agrawal et al. | 371/25.1 |
| 5,132,974 | 7/1992 | Rosales | 371/25.1 |
| 5,345,393 | 9/1994 | Ueda | 371/23 |

OTHER PUBLICATIONS

Chickermane et al., A Fault Oriented Partial Scan Design Approach, 1991, IEEE, pp. 400–403.
Chen et al., Single–Fault Fault Collapsing Analysis in Sequential Logic Circuits, 1990, pp. 809–814.
Erwin Trischler, "Incomplete Scan Path with an Automatic Test Generation Methodology", Proceedings of the International Test Conf. pp. 153–162, 1980.
M. Abramovici et al, "the Best Flip–Flops to Scan", Proceedings of the International Test Conf. pp. 166–173, 1991.
Prashant S. Parikh et al, "A Cost–Based Approach to Partial Scan", Proceedings of the 30th ACM/IEEE Design Automation Conf. pp. 225–259, 1993.
Cheng et al, "An Partial Scan Method for Sequential Circuits with Feedback", IEEE Transactions on Computers, vol. 34, pp. 544–548, Apr. 1990.
M. Abramovici et al, "Smart and Fast Test Generation for VLSI Scan Design Circuits", in IEEE Design and Test of Computers, vol. 3, pp. 43–54, Apr. 1986.

*Primary Examiner*—Emanuel T. Voeltz
*Assistant Examiner*—Hal P. Wachsman
*Attorney, Agent, or Firm*—Philip J. Feig

[57] ABSTRACT

A method of selecting circuit elements in a sequential circuit for partial scan testing relies upon analyzing and breaking reconvergence through the selected circuit element. Different types of reconvergences present in the circuit and their affect on the circuit testability are considered. Harmful reconvergence present in the circuit are broken by scanning a memory element present in the reconvergence path.

18 Claims, 4 Drawing Sheets

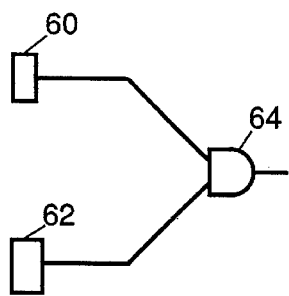
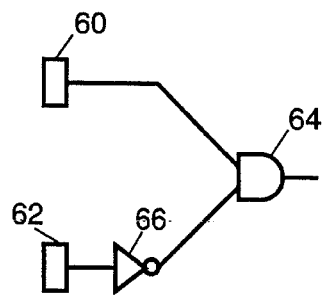
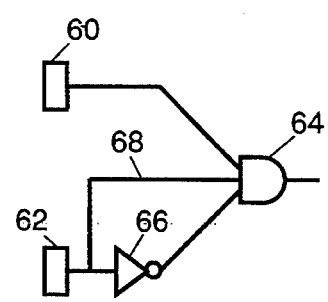
FIG 3(a)   FIG 3(b)   FIG 3(c)
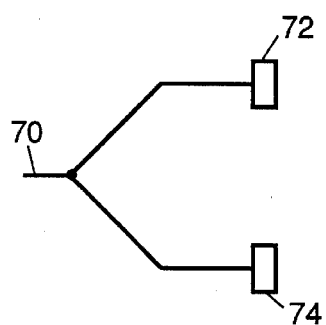
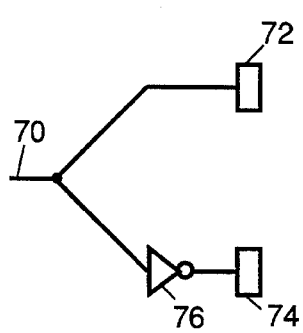
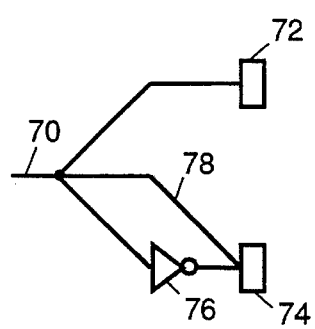
FIG 4(a)   FIG 4(b)   FIG 4(c)

PARTIAL SCAN TESTABILITY UTILIZING RECONVERGENCE THROUGH SEQUENTIAL ELEMENTS

FIELD OF THE INVENTION

The present invention relates to circuit testing and specifically to testing of integrated logic circuits by partial scan methods. Quite specifically, reconvergence through sequential elements in the circuit to be tested forms the basis for determining which circuit elements are selected for partial scan testing.

BACKGROUND OF THE INVENTION

Automatic test generation for sequential circuits is a difficult task. Several different techniques are used to accomplish this task. Complete scan testing, for example, transforms the sequential circuit into a combinational circuit by making all the memory elements controllable and observable. However, it may not be possible to design every circuit for complete scan testing and the cost in terms of performance and testing overhead may be prohibitive. Partial scan testing is a more cost-effective alternative in which only a subset of the memory elements are tested thereby reducing delay and area overhead as well as test application time.

A method of partial scan testing was reported by E. Trischler in an article entitled "Incomplete Scan Path with an Automatic Test Generation Methodology" in Proceedings of the International Test Conference, pages 153–162, 1980, where flip-flops were selected based on their testability measure. An improved partial scan test method based on testability analysis is described in an article by M. Abramovici et al entitled "The Best Flip-Flops to Scan" in Proceedings of the International Test Conference, pages 166–173, 1991. A detectability cost based partial scan test method which achieves significantly better results compared to other similar approaches is described in an article by P. S. Parikh et al entitled "A Cost Based Approach to Partial Scan" in Proceedings of the 30th ACM/IEEE Design Automation Conference, pages 255–259, June 1993.

Attempts at selecting partial scan FFs in a manner for aiding an automatic test pattern generation (ATPG) program have been described. The results of such techniques are strongly influenced by the order in which the target faults are chosen and by the decisions made by the test generator. Another type of partial scan test method selects flip-flops in an effort to cut or break all feedback loops such that during testing, the circuit appears as a pipeline or a balanced pipeline. These circuit-transformation techniques allow the use of a combinational test pattern generator for ATPG.

Cheng and Agrawal in an article entitled "A Partial Scan method of Sequential Circuits with Feedback" in IEEE Transactions on Computers, vol. 34, pages 544–548, April 1990 and in U.S. Pat. No. 5,043,986 disclosed that the feedback cycles among flip-flops are mainly responsible for test generation complexity. It is known by those skilled in the art that partial scan circuits with self-loops but without feedback cycles are easier to test than circuits having feedback cycles. A self-loop refers to a situation where the output of a flip-flop, after passing through combinational logic circuits, is fed back as an input to the same flip-flop. The ability to allow self-loops to remain in the partial scan test circuit is particularly attractive since a large number of flip-flops in practical designs include self-loops. Therefore, the scan overhead encountered in partial scan testing of such circuits containing self-loops would be high if it was necessary to break all feedback loops, including self-loops.

SUMMARY OF THE INVENTION

Cycle-breaking techniques have been the most successful in selecting flip-flops for partial scan testing of circuits. However, breaking all cycles in a circuit does not necessarily mean that sequential ATPG is simple to perform with the circuit. As a result, we discovered that reconvergence through sequential elements often plays a significant role in determining the level of difficulty that a timeframe expansion based ATPG, e.g. HITEC and Gentest, will encompass. As a result, the present invention concerns an algorithm for selecting flip-flops for partial scan testing where reconvergence through sequential elements could be broken. Reconvergence refers to a situation in which a signal having a fanout of two or more conductors, where at least one signal path usually includes logic elements and/or memory elements not found in another path, but two or more of the signal paths terminate as inputs to the same logic element. Such a situation is referred to as reconvergent fanout.

Reconvergence has been studied in connection with the testing of combinational circuits. It has been observed by M. Abramovici et al in a book entitled "Digital Systems Testing and Testable Design," Computer Sciences Press, New York, N.Y., 1990, that reconvergence with inequal inversion parities results in test generation problems. Reconvergence with inequal parities causes fault masking to occur in circuits, thereby making test generation difficult. Also, justification of values within a reconvergent region may be hard to achieve, thus causing many backtracks during test generation. Some controllability measures as described in an article by M. Abramovici et al entitled "SMART and FAST Test Generation for VLSI Scan Design Circuits" in IEEE Design and Test of Computers, vol. 3, pages 43–54, April 1986, based on reconvergent fanouts, have been found to perform better than others that do not consider reconvergent fanouts.

In accordance with the teachings of the present invention, different types of reconvergences present in a circuit to be tested and their affect on the circuit testability are considered. Reconvergences within a combinational portion of a sequential circuit involve only combinational logic gates. However, it is possible for a circuit to have reconvergence through memory elements, such as flip-flops. The object of the invention is to break the reconvergences present in the circuit by scanning a flip-flop present in the reconvergence path. Hence, only reconvergences through sequential elements can be broken using the present invention. Reconvergence through combinational elements is not considered when producing the present invention.

A principal object of the present invention is therefore, the provision of a partial scan testing method based upon reconvergence through sequential elements in a circuit to be tested.

Another object of the present invention is the provision of a partial scan testing method for selecting scan test elements which is based upon inequal parity of input signals to a memory element during the same timeframe.

A further object of the present invention is the provision of a partial scan testing method of selecting scan test elements which is based upon hidden reconvergences.

Further and still other objects of the present invention will become more clearly apparent when the following description is read in conjunction with the accompanying drawing.

BRIEF DESCRIPTION OF THE DRAWING

FIG. 3(a) is a schematic diagram of a circuit illustrating a pair of flip-flops having a convergence through paths of equal parity;

FIG. 3(b) is a schematic diagram of a circuit illustrating a pair of flip-flops having a convergence through paths of inequal parity;

FIG. 3(c) is a schematic diagram of a circuit illustrating a pair of flip-flops having a convergence through paths with both equal and inequal parity;

FIG. 4(a) is a schematic diagram of a circuit illustrating a pair of flip-flops on fanout branches of equal parity;

FIG. 4(b) is a schematic diagram of a circuit illustrating a pair of flip-flops on fanout branches of inequal parity;

FIG. 4(c) is a schematic diagram of a circuit illustrating a pair of flip-flops on fanout branches of both equal and inequal parity.

DETAILED DESCRIPTION OF THE INVENTION

Figure 1A:
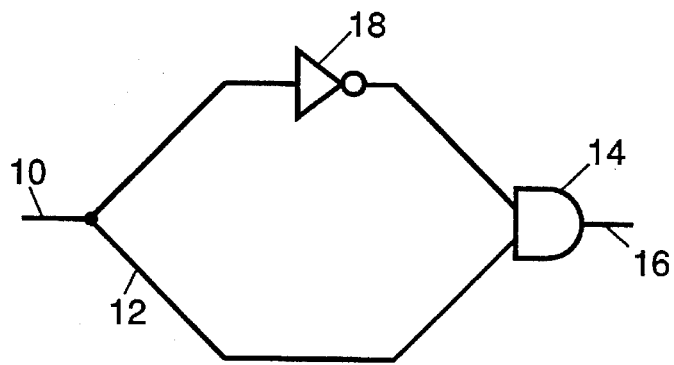
FIGS. 1(a)–1(c) are schematic diagrams of examples of circuit reconvergence which da not affect scan testing flip-flop selection.
Figure 1B:
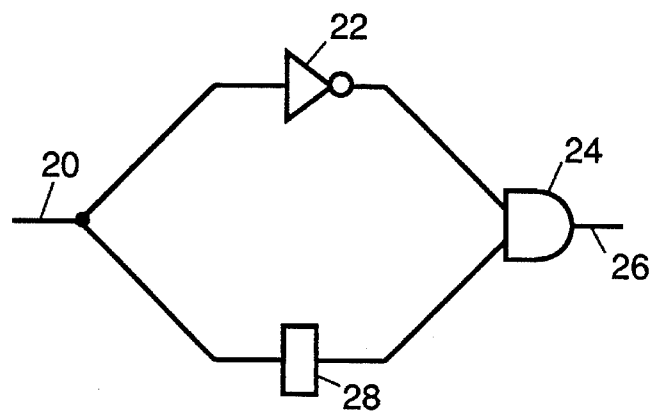
Figure 1C:
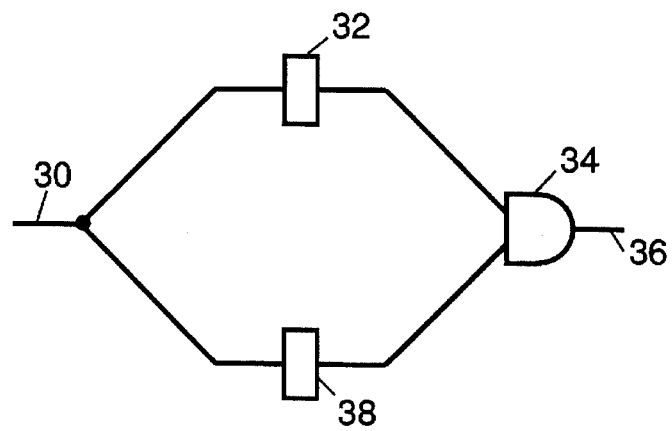

Referring now to the figures, and to FIGS. 1(a) to 1(c) in particular, there are shown schematically different types of reconvergence manifest in sequential circuits. In FIG. 1(a), a signal at conductor 10 travels along conductor 12 to become an input to AND gate 14. The output signal from AND gate 14 is output 16. Alternatively, the signal at conductor 10 travels to an inverter 18 (or other logic element) the output of which becomes another input to AND gate 14. This is an example of reconvergence through combinational elements and does not affect flip-flop selection in accordance with the present invention.

In FIG. 1(b) a signal at conductor 20 can either travel through inverter 22 (or other logic element) the output of which becomes an input of AND gate 24 or travels through flip-flop 28 the output of which becomes another input of AND gate 24. In this example, the values needed at the point of reconvergence (AND gate 24) can be justified at two different timeframes (since the signal traveling through flip-flop 28 is delayed by one timeframe) and hence, do not pose a problem for ATPG.

In FIG. 1(c) a signal at conductor 30 can either travel through flip-flop 32 to AND gate 34 and output 36 or travel through flip-flop 38 to AND gate 34 and output 36. In this case the parity at the two inputs to AND gate 34 are the same, i.e. both the signals from conductor 30 travel through an odd number or both the signals travel through an even number of inverters in the respective path to the inputs of AND gate 34, hence fault masking or conflict in assignment due to reconvergence does not present an ATPG problem.

Each of the conditions shown in FIGS. 1(a), 1(b) and 1(c) does not present a problem for ATPG and hence, the reconvergences in these figures are not considered when selecting flip-flops for partial scan testing in accordance with the present invention.

Reconvergences, where the reconverging paths of inequal parity are identified by classes, are as follows:

Class 0: In this case, the reconvergence is through a different number of flip-flops in the respective paths, where none of the flip-flops have self-loops associated with them. This class of reconvergence does not create any problems for ATPG because the values desired at the reconvergence point have dependence on the value at the fanout stem at different timeframes (due to the different delays in the paths caused by the different number of flip-flops in the paths). The fanout stem is the location where a signal fans out among two or more signal paths.

Class 1: In this case, each reconvergence path has an equal number of flip-flops and none of the flip-flops have self-loops. The signals at the point of reconvergence are dependent on the same value as at the fanout stem at same previous time, and hence there is the possibility of problems through fault masking.

Class 2: In this case, one of the reconvergence paths has a flip-flop with a self-loop, and the remaining paths have flip-flops with or without a self-loop. The value at the output of the flip-flop with a self-loop has dependence on the input values at many previous timeframes. Consequently, the values at the point of reconvergence may be dependent on the same value as the fanout stem at some previous timeframe.

Class 3: In this case, there are no explicit fanout reconvergences through flip-flops in the circuit. An example of this case is present where there are flip-flops with self-loops that are connected in a linear chain. The difficulty in ATPG is remedied by scanning one of the flip-flops in the chain.

An example of a Class 0 reconvergence is shown in FIG. 1(b), which as noted above does not pose any problem for ATPG. If the inversion parity of one of the paths in FIG. 1(c) were modified, for example by adding an inverter in one of the paths, the parity of the path would be different from that of the other path. The resultant circuit would be an example of a Class 1 reconvergence.

Figure 2A:
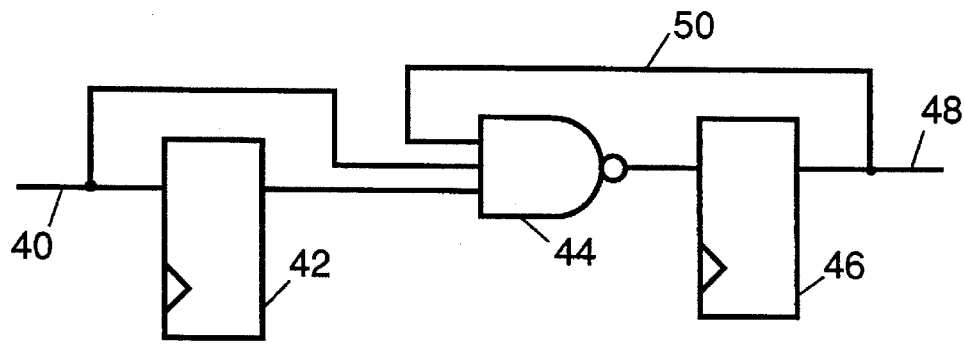
FIG. 2(a) is a schematic diagram of a circuit having a hidden reconvergence.
Figure 2B:
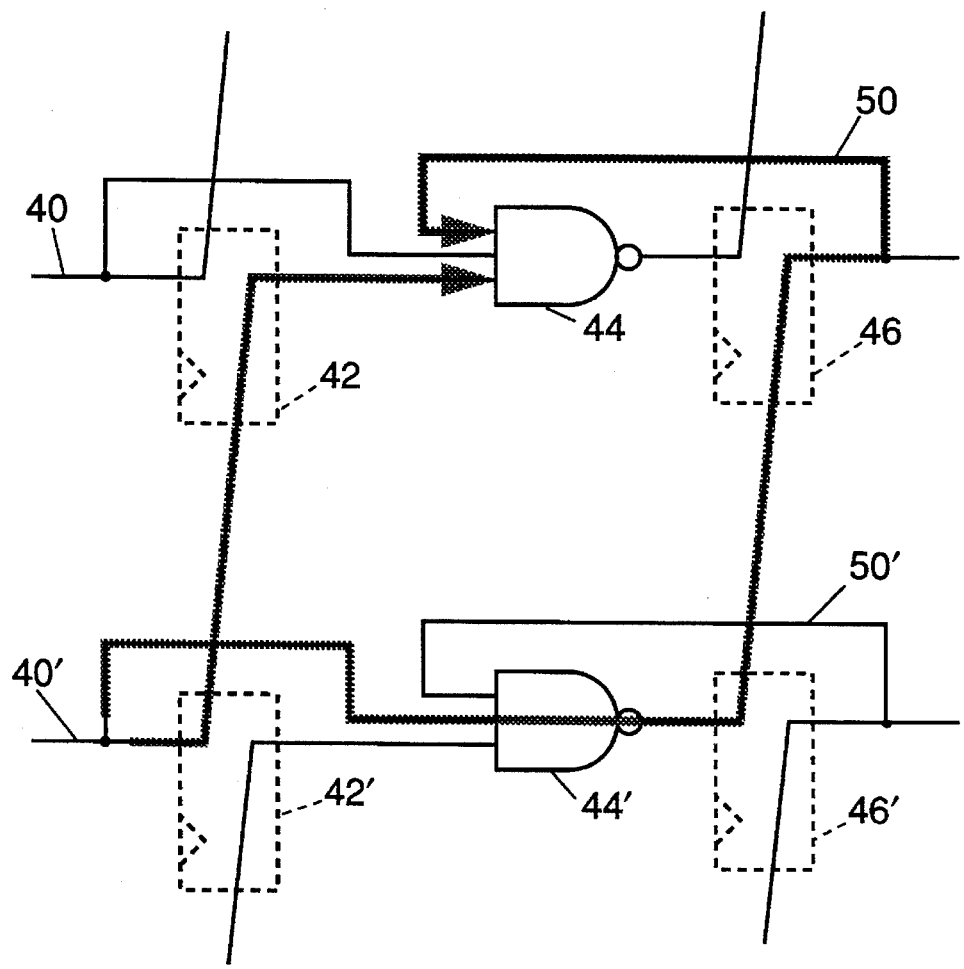
FIG. 2(b) is a schematic diagram of the circuit in FIG. 2(a) expanded in timeframes to show the hidden reconvergence.

FIGS. 2(a) and 2(b) illustrate examples of Class 2 and Class 3 reconvergences. Referring to FIG. 2(a) there is shown an input conductor 40 having a fanout to an input of flip-flop 42 and an input of NAND gate 44. The output of NAND gate 44 is connected to the input of a flip-flop 46. The output of flip-flop 46 has fanout to output 48 and to conductor 50 back to an input of NAND gate 44. The output of flip-flop 42 is also an input of NAND gate 44. There is no global feedback apparent in the circuit and there is one self-loop. The self-loop comprises NAND gate 44, flip-flop 46 and conductor 50 from the output of flip-flop 46 to the input of NAND gate 44. The circuit appears not to have any reconvergence or other problem.

However, referring to FIG. 2(b) which shows a timeframe expansion of the circuit in FIG. 2(a) but duplicated for testing purposes (and identified with prime notation). The lower circuit with prime notation elements, represents the signals at $t=t_0$ while the original upper circuit represents the signals as $t=t_1$. An input at NAND gate 44 from input 40' travels through flip-flop 42-42' to arrive at time $t=t_1$. Another input at NAND gate 44 is the signal from conductor 40', traveling through NAND gate 44', flip-flop 46-46' and conductor 50 to arrive at time $t=t_1$. Therefore, these two signals arrive at the same times but have inequal parity by virtue of the latter signal traveling through NAND gate 44'.

Hence, there is a hidden reconvergence problem at the fanout of conductor 40'. By scanning either flip-flop 42 or flip-flop 46 the reconvergence will be broken.

Finding all reconvergences in a reasonably large circuit is an extremely computationally intensive task. Reconvergence through a large number of flip-flips can create a serious problem in test generation, however, in practical circuits such reconvergences are less frequent when compared to reconvergences through short paths. The algorithm comprising the present invention will be described for reconvergence through a level of a single flip-flop only. However, it will be apparent to those skilled in the art that extension to reconvergences through levels of several flip-flops is straight forward.

In order to find reconvergences through flip-flops, a three step procedure comprising a Fanout Check, Fanin Check, and Reconvergence Check, is performed. This procedure finds all the reconvergences through single flip-flops.

The first step of the procedure is a Fanout Check. Referring to FIGS. 3(a) to 3(c), for each pair of flip-flops, a check is made to determine if there is a cone having disjoint paths to the two flip-flops. If such a cone exists, a comparison of the parities of the paths is made. A cone refers to a situation where a logic element has inputs from more than one path containing flip-flops. Pairs of flip-flops are categorized as follows:

(NONE) Pairs of flip-flops that have no such cone.

(EQ) Pairs of flip-flops that have cones with equal parity such as is shown in FIG. 3(a). In FIG. 3(a) the outputs of both flip-flop 60 and flip-flop 62 are inputs to AND gate 64, thus forming a cone. Since there are no inverters in either path, i.e. from flip-flop 60 to AND gate 64 and from flip-flop 62 to AND gate 64, both paths have equal parity. Alternatively, if both paths contained an odd number of inverters or if both paths contained an even number of inverters, the paths are referred to as having equal parity. The odd number or the even number in each path need not be the same.

(INEQ) Pairs of flip-flops that have cones with inequal parity as shown in FIG. 3(b). In FIG. 3(b) an inverter 66 is located in the path between flip-flop 62 and AND gate 64. Hence, there is an odd number of inversions in one path (flip-flop 62 to AND gate 64) and an even number or no quantity of inversions in the other path. Thus, the two paths have inequal parity.

(BOTH) Pairs of flip-flops that have cones with both equal and inequal parities as shown in FIG. 3(c). In FIG. 3(c), the circuit shown in FIG. 3(b) is modified by the addition of a conductor 68 from the output of flip-flop 62 to an input of AND gate 64. The circuit has both equal parity (flip-flop 60 to AND gate 64 with flip-flop 62 via conductor 68 to AND gate 64) and inequal parity (flip-flop 60 to AND gate 64 with flip-flop 62 and inverter 66 to AND gate 64).

The second step of the procedure is a Fanin Check. Referring to FIGS. 4(a) to 4(c), for each pair of flip-flops, a check is made to determine if there is a convergence that has disjoint paths from the two flip-flops. If such convergences exist, a comparison of the parities of the paths is made. Pairs of flip-flops are categorized as follows:

(NONE) Pairs of flip-flops that have no such convergence.

(EQ) Pairs of flip-flops that have convergences with equal parity such as is shown in FIG. 4(a). In FIG. 4(a) the signal at conductor 70 is provided as an input to a pair of flip-flops 72,74. Since there are no inverters in either input path, from conductor 70 to flip-flop 72 and from conductor 70 to flip-flop 74, both paths have equal parity. Alternatively, if both paths contained an odd number of inverters or if both paths contained an even number of inverters, the paths are reffered to as having equal parity. The odd number or the even number in each path need not be the same.

(INEQ) Pairs of flip-flops that have convergences with inequal parity as shown in FIG. 4(b). In FIG. 4(b) an inverter 76 is added to the path from conductor 70 to flip-flop 74. Since there is an odd number of inverters in one of the paths (from conductor 70 to flip-flop 74) and an even number or no inverters in the other path (from conductor 70 to flip-flop 72), the two paths have inequal parity.

(BOTH) Pairs of flip-flops that have convergences with both equal and in-equal parity as shown in FIG. 4(c). In FIG. 4(c) the circuit shown in FIG. 4(b) is modified by the addition of a conductor 78 from conductor 70 to an input of flip-flop 74. The circuit has both equal parity (from conductor 70 to flip-flop 72 and from conductor 70 via conductor 78 to flip-flop 74) and inequal parity (from conductor 70 to flip-flop 72 and from conductor 70 via inverter 76 to flip-flop 74).

The third step of the procedure is a check if there is a reconvergence through the flip-flops, of each pair of flip-flops, by comparing the categories to which the flip-flops belong. If the pair meets any of the following conditions, there is a potentially harmful reconvergence through the flip-flops:

1. if (fanout condition)≠NONE and (fanin condition)= BOTH 2. if (fanin condition)≠NONE and (fanout condition)= BOTH 3. if (fanout condition)≠EQ and (fanout condition)=INEQ 4. if (fanout condition)≠INEQ and (fanout condition)=EQ Such potentially harmful reconvergences can create problems for ATPG, and hence the presence of any of these conditions are included in the selection analysis as described below. The presence of any other combination of fanin condition and fanout condition is disregarded for purposes of the present invention.

Figure 5:
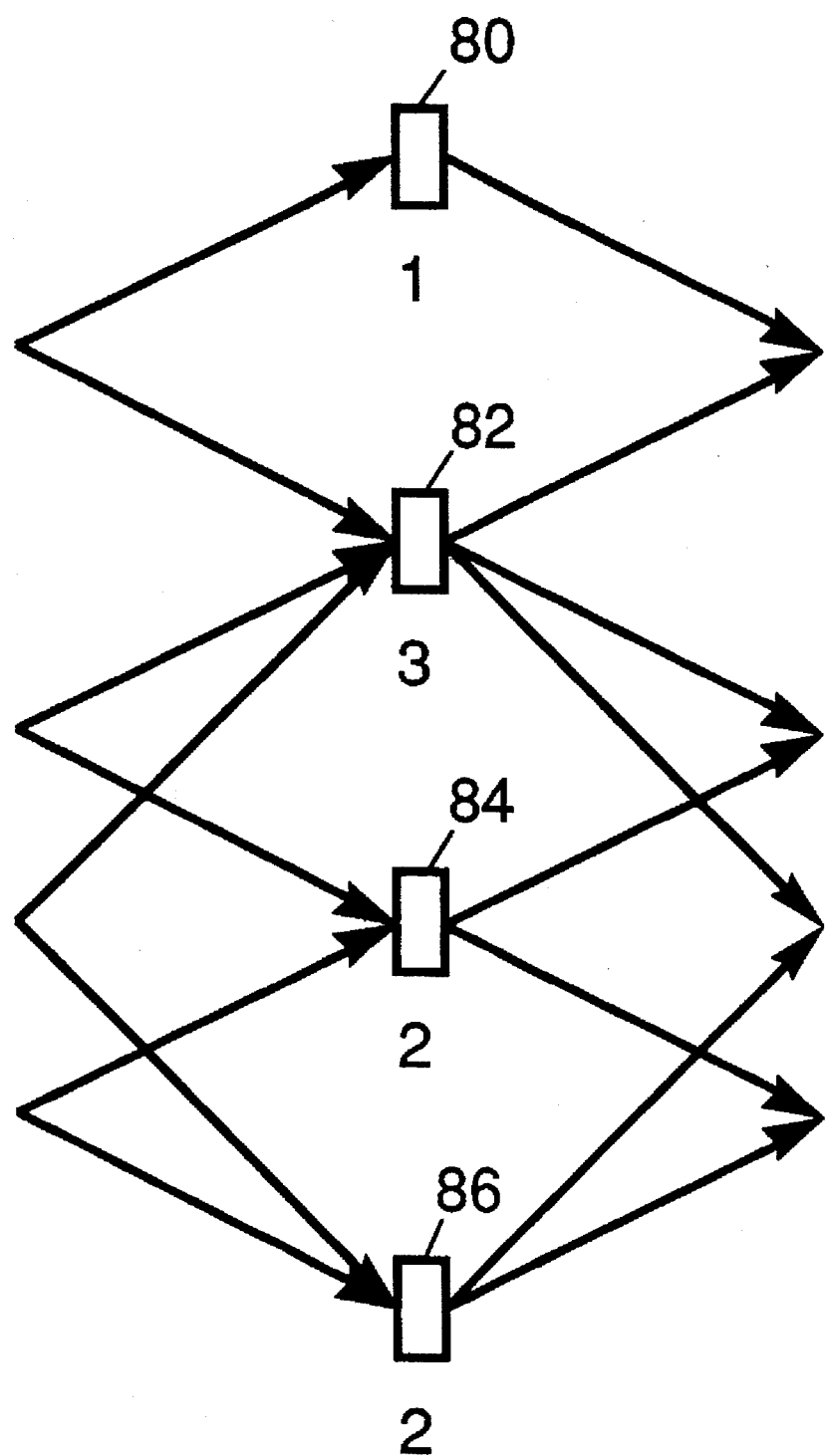
FIG. 5 illustrates a portion of the result of applying the algorithm forming the present invention in terms of a reconvergence frequency associated with each flip-flop in a circuit to be tested.

In order to implement the algorithm comprising the present invention, it is necessary to find the frequency of appearance of potentially harmful reconvergences for all the flip-flops in the circuit. A simplified example of the application of the algorithm is shown in FIG. 5. For each flip-flop in the circuit potentially harmful reconvergences are counted. In the example shown in FIG. 5 flip-flop 80 has one harmful reconvergence and flip-flop 82, flip-flop 84 and flip-flop 86 have three, two, and two harmful reconvergences respectively. In the process of applying the algorithm, flip-flop 82 having the highest number of harmful reconvergences will be the first choice as a partial scan test flip-flop out of the flip-flops shown in FIG. 5.

A difficulty in test generation occurs wheel both cycles and reconvergent fanouts are present in the circuit. The present invention attempts to break the circuit at the reconvergences within strongly connected components (SCCs). In a given circuit to be tested, potentially harmful reconvergences for each pair of flip-flops are found. For each flip-flop, the frequency of appearances in the reconvergence is counted and saved as described above. Either before, after or concurrently with the testing for harmful reconvergences, an S-graph of the circuit to be tested is extracted. SCCs in the S-graph are found in a known manner.

In the process of defining the partial scan test problem, usually the size of the largest SCC in the S-graph is a predetermined parameter or alternatively, the maximum quantity of flip-flops to be scanned is a predetermined parameter.

If the size of the largest SCC is the predetermined parameter, the following steps are followed. The largest SCC in the circuit is S-graph identified. Of all the flip-flops contained in the largest SCC, the flip-flop with the largest frequency of appearance in the reconvergence is selected from the SCC as a scan flip-flop. All the connectivities to the selected flip-flop are removed and the frequencies of appearance of the remaining flip-flops are updated accordingly. The process repeats until all the SCCs in the updated S-graph are smaller than the predetermined parameter at which time all the scan test flip-flops have been identified.

If instead of the size of the largest SCC being the predetermined parameter, the maximum number of flip-flops to be scanned is the predetermined parameter, the algorithm is repeated until the number of scan test flip-flops is less than or equal to the predetermined maximum number of flip-flops. Whenever a scan test flip-flop is to be selected from a SCC, the flip-flop in the SCC having the highest count of reconvergences is selected as the scan test flip-flop. The pseudo-code of the algorithm, referred to as PARSE(), is as follows:
Procedure PARSE()

The experiments were performed on a subset of ISCA89 benchmark circuits. Table 1 shows the number of flip-flops and total number of faults in these circuits.

TABLE 1

| | Circuit parameters. | |
|---|---|---|
| Circuit | No. of FF | No. of faults |
| s27 | 3 | 32 |
| s298 | 14 | 308 |
| s344 | 15 | 342 |
| s349 | 15 | 350 |
| s382 | 21 | 399 |
| s386 | 6 | 384 |
| s400 | 21 | 426 |
| s444 | 21 | 474 |
| s510 | 6 | 564 |
| s526 | 21 | 555 |
| s526n | 21 | 553 |
| s641 | 19 | 467 |
| s713 | 19 | 581 |
| s820 | 5 | 850 |
| s832 | 5 | 870 |
| s953 | 29 | 1079 |
| s1423 | 74 | 1515 |
| s1488 | 6 | 1486 |
| s1494 | 6 | 1506 |

Procedure PARSE()

1. For each pair of flip-flops, find potentially harmful reconvergences
2. For each flip-flop, count the frequency of appearances in the reconvergences
3. Extract the S-graph
4. Find SCCs
5. If (size of largest SCC is given) then {
6.   while (size of any SCC > specified largest SCC) {
7.     Select the largest SCCs
8.     Select the flip-flop with the largest frequency of appearance from the SCCs
9.     Remove all the reconvergences containing the selected flip-flop, and update frequencies of appearance accordingly
10.    Remove the node corresponding to the selected flip-flop from the S-graph, and find SCCs again
11.   }/* end while */
  }/* end if */
12. Else if (the maximum no. of flip-flops to be scanned is given) then {
13.   while (number of flip-flops scanned < maximum allowed to be scanned) {
14.     Repeat steps 7 through 10
15.   }/* end while */
  }/* end else if */
16. Else {/* else clause of if */
17.   Take the largest size of SCC = 1 and repeat steps 6 through 10
18. }/* end else */

While identifying strongly connected components and removing the largest strongly connected component is a preferred method of practicing the present invention, alternative methods may be used to practice the invention. For example, flip-flops to be removed and hence, to be selected as scan flip-flops, may be selected on the basis of in-degree count, out-degree count or articulation point selection (where there is the largest number of edges coming into or going out of an S-graph node).

The procedure PARSE has been implemented in C language. The results of the algorithm have been compared with a state of the art program, Opus, which attempts to select flip-flops to break all cycles (except self-loops) in the S-graph. All experiments were performed on a Sparc2 SUN workstation. It will be apparent that steps 3 and 4 of the algorithm may be performed prior to steps 1 and 2 or concurrently with steps 1 and 2.

TABLE 1-continued

| | Circuit parameters. | |
|---|---|---|
| Circuit | No. of FF | No. of faults |
| s5378 | 179 | 4603 |
| s9234.1 | 211 | 6102 |
| s13207.1 | 638 | 9743 |

The procedure PARSE was run on all the circuits with no limit regarding the number of flip-flops to be scanned. Only reconvergences through a single flip-flop on each fanout path were considered, and hence the procedure PARSE terminates when all such reconvergences are broken. Similarly, Opus was run until the breaking of all loops. The results of this experiment is shown in Table 2. It can be seen that for some circuits, Opus performs better in terms of fault coverage and ATPG time. However, for some circuits, for example, s382 and s9234.1, the procedure PARSE performs better than Opus for the same number of flip-flops scanned.

Since for some circuits the procedure PARSE was scanning more flip-flops than Opus, another experiment was performed where the procedure PARSE was run with a limit placed on the number of flip-flops to be scanned. The predetermined limit was made equal to the number of flip-flops required by Opus to break all

TABLE 2

Performance with unlimited FFs.

| | OPUS | | | | PARSE | | | |
|---|---|---|---|---|---|---|---|---|
| Circuit | % scan | % FC | % TE | CPU sec | % scan | % FC | % TE | CPU sec |
| s27 | 33.3 | 100 | 100 | 0.1 | 33.3 | 100 | 100 | 0.1 |
| s298 | 7.1 | 94.2 | 98.4 | 38.5 | 14.3 | 98.1 | 99.7 | 9.9 |
| r344 | 33.3 | 99.4 | 99.7 | 3.8 | 40.0 | 99.4 | 99.7 | 3.6 |
| s349 | 33.3 | 98.9 | 99.7 | 4.1 | 40.0 | 98.9 | 99.7 | 3.6 |
| s382 | 42.9 | 98.8 | 100 | 5.5 | 42.9 | 99.3 | 100 | 3.2 |
| s386 | 83.3 | 100 | 100 | 3.9 | 83.3 | 100 | 100 | 2.9 |
| s400 | 42.9 | 97.4 | 100 | 5.8 | 42.9 | 97.9 | 100 | 3.8 |
| s444 | 42.9 | 96.0 | 99.8 | 6.9 | 42.9 | 96.6 | 100 | 3.6 |
| s510 | 83.3 | 100 | 100 | 4.0 | 83.3 | 100 | 100 | 3.9 |
| s526 | 14.3 | 55.5 | 57.3 | 517.0 | 23.8 | 69.0 | 71.0 | 375.3 |
| s526n | 14.3 | 56.1 | 57.7 | 499.3 | 23.8 | 68.7 | 70.5 | 373.2 |
| s641 | 36.8 | 94.7 | 99.8 | 15.3 | 36.8 | 94.7 | 99.6 | 16.2 |
| s713 | 36.8 | 88.5 | 99.0 | 31.4 | 36.8 | 88.5 | 99.3 | 27.2 |
| s820 | 80.0 | 100 | 100 | 12.3 | 80.0 | 100 | 100 | 11.8 |
| s832 | 80.0 | 98.9 | 100 | 14.0 | 80.0 | 99.0 | 100 | 11.6 |
| s953 | 17.2 | 100 | 100 | 10.9 | 17.2 | 99.9 | 100 | 11.9 |
| s1423 | 29.7 | 83.0 | 83.0 | 622.3 | 55.4 | 89.4 | 90.0 | 380.9 |
| s1488 | 83.8 | 100 | 100 | 22.1 | 83.8 | 100 | 100 | 24.6 |
| s1494 | 83.8 | 99.5 | 100 | 23.3 | 83.8 | 99.3 | 100 | 24.8 |
| s5378 | 16.8 | 93.8 | 95.9 | 882.2 | 30.2 | 97.0 | 99.1 | 365.9 |
| s9234.1 | 26.1 | 72.1 | 74.4 | 5629.0 | 26.1 | 73.1 | 76.3 | 5063.0 |
| s13207.1 | 9.1 | 5.1 | 8.8 | 29370.4 | 15.2 | 6.9 | 10.5 | 23899.5 | cycles. Table 3 shows the result of this experiment. It can be seen that in most of the cases, procedure PARSE performed better than Opus in terms of fault coverage, test efficiency, and ATPG CPU time. An example of procedure PARSE performing better than Opus is s5378. While Opus requires 16.8% of the flip-flops in the circuit to be scanned to achieve a fault coverage of 93.8%, a test efficiency of 95.9%, with an ATPG CPU time of 882 seconds, for the same number of scan flip-flops, the procedure PARSE achieved a fault coverage of 94.7%, a test efficiency of 96.5%, with an ATPG time of 724.8 CPU seconds.

Partial scan testing of integrated circuits is an alternative for improving testability of a circuit without incurring an unacceptable penalty in terms of area and performance. Among several techniques known for partial scan testing, the most successful method previously has been the one performing cycle breaking. Cycle breaking while a beneficial technique, does not solve the testing problem completely

TABLE 3

Performance with same number of FFs.

| | OPUS | | | | PARSE | | |
|---|---|---|---|---|---|---|---|
| Circuit | % scan | % FC | % TE | CPU sec | % FC | % TE | CPU sec |
| s27 | 33.3 | 100 | 100 | 0.1 | 100 | 100 | 0.1 |
| s298 | 7.1 | 94.2 | 98.4 | 38.5 | 98.1 | 99.7 | 15.1 |
| s344 | 33.3 | 99.4 | 99.7 | 3.8 | 99.4 | 99.7 | 3.5 |

TABLE 3-continued

Performance with same number of FFs.

| | OPUS | | | | PARSE | | |
|---|---|---|---|---|---|---|---|
| Circuit | % scan | % FC | % TE | CPU sec | % FC | % TE | CPU sec |
| s349 | 33.3 | 98.9 | 99.7 | 4.1 | 98.9 | 99.7 | 3.7 |
| s382 | 42.9 | 98.8 | 100 | 5.5 | 99.3 | 100 | 3.2 |
| s400 | 42.9 | 97.4 | 100 | 5.8 | 97.9 | 100 | 3.8 |
| s444 | 42.9 | 96.0 | 99.8 | 6.9 | 96.6 | 100 | 3.6 |
| s526 | 14.3 | 55.5 | 57.3 | 517.0 | 53.2 | 55.1 | 551.4 |
| s526n | 14.3 | 56.1 | 57.7 | 499.3 | 46.7 | 48.5 | 604.7 |
| s641 | 36.8 | 94.7 | 99.8 | 15.3 | 94.7 | 99.6 | 16.2 |
| s713 | 581 | 88.5 | 99.0 | 31.4 | 88.5 | 99.3 | 27.2 |
| s953 | 17.2 | 100 | 100 | 10.9 | 99.9 | 100 | 11.9 |
| s1423 | 29.7 | 83.0 | 83.0 | 622.3 | 74.0 | 74.5 | 966.4 |
| s5378 | 16.8 | 93.8 | 95.9 | 882.2 | 94.7 | 96.5 | 724.8 |
| s9234.1 | 26.1 | 72.1 | 74.4 | 5629.0 | 73.1 | 76.3 | 5063.0 |
| s13207.1 | 9.1 | 5.1 | 8.8 | 29370.4 | 4.6 | 13.0 | 27199.7 | for all circuits. The present invention discloses a method for selecting partial scan flip-flops by analyzing and breaking reconvergence through flip-flops. Breaking reconvergence provides a method of cycle breaking such that for many circuits better fault coverage and ATPG performance is obtained for same or smaller number of scan flip-flops than achieved using conventional cycle breaking methods.

While there has been described and illustrated a preferred method of selecting partial scan testing circuit elements in a sequential circuit to be tested, it will be apparent to those skilled in the art that variations and modifications are possible without deviating from the broad principle and spirit of the present invention which shall be limited solely by the scope of the claims appended hereto.

What is claimed is:

1. A method of selecting scan elements in a circuit to be tested having sequential elements comprising the steps of:
   (a) finding reconvergence structures in the circuit to be tested;
   (b) determining harmful reconvergence structures containing memory elements;
   (c) for each respective memory element in a harmful reconvergence structure, providing a count commensurate with the number of harmful reconvergence structures containing each respective memory element;
   (d) removing a memory element having the highest count; and
   (e) repeating steps (a) to (d) with the memory element in step (d) removed.

2. A method of selecting scan elements in a circuit to be tested as set forth in claim 1, further comprising the step of testing the circuit to be tested by the partial scan method where the memory elements removed in step (d) are the scan elements.

3. A method of selecting scan elements in a circuit to be tested as set forth in claim 1, further including steps (f) and (g) after performing step (c), where step (f) is deriving a S-graph of the circuit to be tested and step (g) is identifying strongly connected components in said S-graph, and where step (d) removes a memory element having the highest count from a strongly connected component.

4. A method of selecting scan elements in a circuit to be tested as set forth in claim 3, further comprising the step of testing the circuit to be tested by the partial scan method where the memory elements removed in step (d) are the scan elements.

5. A method of selecting scan elements in a circuit to be tested as set forth in claim 3, where step (d) is performed on the strongly connected component having the largest size in the S-graph derived from the circuit to be tested.

6. A method of selecting scan elements in a circuit to be tested as set forth in claim 5, further comprising the step of testing the circuit to be tested by the partial scan method where the memory elements removed in step (d) are the scan elements.

7. A method of selecting scan elements in a circuit to be tested as set forth in claim 5 where step (c) is repeated until all strongly connected components have a size less than a predetermined size.

8. A method of selecting scan elements in a circuit to be tested as set forth in claim 7, further comprising the step of testing the circuit to be tested by the partial scan method where the memory elements removed in step (d) are the scan elements.

9. A method of selecting scan elements in a circuit to be tested as set forth in claim 1, where step (e) is performed until a predetermined number of memory elements are removed.

10. A method of selecting scan elements in a circuit to be tested as set forth in claim 9, further comprising the step of testing the circuit to be tested by the partial scan method where the memory elements removed in step (d) are the scan elements.

11. A method of selecting scan elements in a circuit to be tested having sequential elements comprising the steps of:
   (a) for pairs of flip-flops in a reconvergence path (i) performing fanout checks and characterizing pairs of flip-flops as NONE, EQ, INEQ and BOTH and (ii) performing fanin checks and characterizing pairs of flip-flops as NONE, EQ, INEQ, and BOTH;
   (b) checking for each pair of flip-flops whether any of the following criteria is met:
   fanout check≠NONE and fanin check≠BOTH
   or fanin check≠NONE and fanout check≠BOTH
   or fanout check≠EQ and fanout check≠INEQ
   or fanout check≠INEQ and fanout check≠EQ;
   (c) if for any pair of flip-flops at least one criteria is met, for both flip-flops in the pair incrementing a count indicative of a reconvergence and then perform steps (a), (b) and (d) for another pair of flip-flops;
   (d) if for any pair of flip-flops none of the criteria is met, perform steps (a), (b), (c) and (d) for another pair of flip-flops.

12. A method of selecting scan elements in a circuit to be tested as set forth in claim 11, further comprising the steps of:
   (e) deriving a S-graph of the circuit to be tested;
   (f) identifying strongly connected components in the S-graph; and
   (g) selecting the largest strongly connected components in the S-graph and remove all reconvergences containing the flip-flop having the highest count in the largest strongly connected components.

13. A method of selecting scan elements in a circuit to be tested as set forth in claim 12; further comprising the steps of:
   (h) repeat steps (a), (b), (c) and (d) for each remaining pairs of flip-flops;
   (i) repeat steps (e), (f) and (g) for the circuit without the flip-flop selected in previous step (g); and
   (j) repeat steps (h) and (i) until all strongly connected components are less than a predetermined size.

14. A method of selecting scan elements in a circuit to be tested as set forth in claim 13, further comprising the steps of (1) testing the circuit to be tested by the partial scan method where the flip-flops selected in repeated steps (g) are used as the scan elements.

15. A method of selecting scan elements in a circuit to be tested as set forth in claim 12, further comprising the steps of:
   (h) repeat steps (a), (b), (c) and (d) for each remaining pairs of flip-flops;
   (i) repeat steps (e), (f) and (g) for the circuit without the flip-flop selected in previous step (g); and
   (k) repeat steps (h) and (i) until a predetermined number of flip-flops have been selected in repeated steps (g).

16. A method of selecting scan elements in a circuit to be tested as set forth in claim 15, further comprising the steps of (1) testing the circuit to be tested by the partial scan method where the flip-flops selected in repeated steps (g) are used as the scan elements.

17. A method of selecting scan elements in a circuit to be tested having sequential elements comprising the steps of:
   (a) finding reconvergence structures in the circuit to be tested;
   (b) determining harmful reconvergence structures containing memory elements;
   (c) for each respective memory element in a harmful reconvergence structure, providing a count commensurate with the number of harmful reconvergence structures containing each respective memory element;

(d) deriving an S-graph of the circuit to be tested;
(e) removing a memory element having the highest count according to a method selected from the group consisting of in-degree count, out-degree count, and articulation point selection; and
(f) repeating steps (a) to (e) with the memory element in step (e) removed.

18. A method of selecting scan elements in a circuit to be tested as set forth in claim 17, further comprising the step of testing the circuit to be tested by the partial scan method where the memory elements removed in step (e) are the scan elements.

* * * * *